(12) United States Patent
Namba et al.

(10) Patent No.: US 7,170,215 B2
(45) Date of Patent: Jan. 30, 2007

(54) ELECTRONIC COMPONENT AND METHOD FOR MANUFACTURING THE SAME

(75) Inventors: Akihiko Namba, Osaka (JP); Keiji Onishi, Settsu (JP); Katsu Takeda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 160 days.

(21) Appl. No.: 10/865,125

(22) Filed: Jun. 10, 2004

(65) Prior Publication Data

US 2004/0256961 A1 Dec. 23, 2004

(30) Foreign Application Priority Data

Jun. 18, 2003 (JP) .............................. 2003-173864

(51) Int. Cl.
*H01L 41/08* (2006.01)
(52) U.S. Cl. ..................... 310/324; 310/331; 310/364
(58) Field of Classification Search .............. 310/324, 310/330–332, 367–369
See application file for complete search history.

(56) References Cited

U.S. PATENT DOCUMENTS

| | | | |
|---|---|---|---|
| 3,384,768 A | | 5/1968 | Shockley et al. |
| 4,370,583 A | * | 1/1983 | Ljung .......................... 310/331 |
| 5,594,292 A | * | 1/1997 | Takeuchi et al. ............. 310/324 |
| 5,692,279 A | * | 12/1997 | Mang et al. ................ 29/25.35 |
| 6,191,524 B1 | * | 2/2001 | Sasaki et al. ................ 310/367 |
| 6,469,597 B2 | | 10/2002 | Ruby et al. |
| 6,483,229 B2 | | 11/2002 | Larson, III et al. |
| 6,566,979 B2 | | 5/2003 | Larson, III et al. |
| 6,617,249 B2 | | 9/2003 | Ruby et al. |
| 6,828,713 B2 | * | 12/2004 | Bradley et al. .............. 310/324 |

(Continued)

FOREIGN PATENT DOCUMENTS

JP 2002-335141 11/2002

(Continued)

OTHER PUBLICATIONS

K.M. Lakin: "Thin Film Resonators and High Frequency Filters" Technical Report TFR Technologies, Jun. 1, 2001, pp. 1-18, XP-002276553.

*Primary Examiner*—Mark Budd
(74) *Attorney, Agent, or Firm*—Hamre, Schumann, Mueller & Larson P.C.

(57) ABSTRACT

An electronic component includes a substrate; a piezoelectric material layer supported directly or indirectly by the substrate; a first electrode arranged on a surface of the piezoelectric material layer on an opposite side of the substrate; and a second electrode arranged on a surface of the piezoelectric material layer on the substrate side. The piezoelectric material layer is sandwiched between the first electrode and the second electrode. The first electrode has a smaller surface area than the piezoelectric material layer. A portion where the piezoelectric material layer is exposed from the first electrode includes a portion that is thinner than a thickness of the piezoelectric material layer between the first electrode and the second electrode. Thus, it is possible to configure a resonator with a higher frequency than its ordinary resonance, and it is easy to achieve an adjustment of the resonance frequency of the resonator, as well as improving the yield of the component and enabling the configuration of an electronic component that includes a plurality of resonators of different frequencies.

15 Claims, 11 Drawing Sheets

U.S. PATENT DOCUMENTS

| | | |
|---|---|---|
| 6,842,088 B2 * | 1/2005 | Yamada et al. .............. 333/187 |
| 2002/0030424 A1 * | 3/2002 | Iwata ......................... 310/363 |
| 2002/0121498 A1 | 9/2002 | Bradley et al. |
| 2002/0121499 A1 | 9/2002 | Bradley et al. |
| 2003/0015941 A1 * | 1/2003 | Nakatani et al. ............ 310/330 |
| 2004/0256953 A1 * | 12/2004 | Kitagawa et al. ........... 310/324 |

FOREIGN PATENT DOCUMENTS

| | | |
|---|---|---|
| JP | 2002-359534 | 12/2002 |
| JP | 2002-359539 | 12/2002 |
| WO | 2002/103900 | 12/2002 |

* cited by examiner

ELECTRONIC COMPONENT AND METHOD FOR MANUFACTURING THE SAME

FIELD OF THE INVENTION

The present invention relates to electronic components and methods for manufacturing the same that are useful in the predetermined frequency bands of filters and oscillators for example. More specifically, the present invention relates to electronic components and methods for manufacturing the same that are used as a frequency filter (hereafter "filter") or an oscillator mounted in a communication device such as a mobile telephone or keyless entry device and the like.

BACKGROUND OF THE INVENTION

Along with advances toward higher frequencies and miniaturization of information and telecommunications devices such as portable telephones, electronic components such as filters and oscillators used in these devices are also undergoing advances toward higher frequencies and miniaturization. As shown in FIG. 11 for example, filters and the like are being used in which a bulk acoustic wave (BAW) resonator is used. Ordinarily, piezoelectric materials are used to produce BAWs, and the resonance frequency of the resonator is determined by the dimensions of the piezoelectric material, such as its thickness for example. Examples of piezoelectric materials include piezoelectric single crystals such as lithium tantalate and lithium niobate, piezoelectric ceramics such as PZT (lead zirconate titanate), and piezoelectric thin films such as ZnO (zinc oxide) and AlN (aluminum nitride), but piezoelectric single crystals and piezoelectric thin films are most commonly used in products that have exacting specifications in terms of frequency precision such as those used in mobile communications and the like. It is common to use piezoelectric single crystals when the range of frequencies that is used is not greater than several hundreds of MHz, and to use piezoelectric thin films for frequency ranges greater than that. This is because the resonance frequency of the above-mentioned BAW resonators is determined by the shape of the element. For example, the resonance frequencies for BAW wave modes such as thickness longitudinal oscillation and thickness shear oscillation used in filters and the like are determined by the thickness of piezoelectric material. Accordingly, the precision of the thickness of the piezoelectric material corresponds to the precision of the component's frequency, and thus thickness adjustments are an important issue. Adjustments of frequencies, that is, plate thicknesses, can be divided into rough adjustments and fine adjustments. Rough adjustments are performed by using grinding for piezoelectric single crystals, and by controlling the film formation process for piezoelectric thin films. Fine adjustments supplement rough adjustments, and are an essential technology for improving component performance and improving yield. Furthermore, with a piezoelectric thin film that will be discussed below, miniaturization is possible by forming a component on a single chip, and this is also an important technology for being able to form resonators that have different resonance frequencies on the same substrate. The most commonly used fine adjustment method is an adjustment vapor deposition method using the mass loading effect. This is a method in which a frequency adjustment is carried out by depositing on the excitation electrode, with which the BAW resonator is provided, a further electrode for frequency shifting. It should be noted that resonance frequency is reduced by mass loading.

Furthermore, as an example of a different method, a method is proposed such as that in JP 2002-359539A. As shown in FIG. 18, an electrode 202 and a piezoelectric material 201 are arranged on a substrate 206. Cavities are provided in the substrate 206 corresponding to portions of the piezoelectric material 201 that perform elastic oscillation. Moreover, there are two resonators present. On the piezoelectric material 201 there are a resonator provided with a surface electrode 205 and a resonator provided with a surface electrode 203. By including an oxidized conductor portion 204 as a portion of the surface electrode 203, the mass of the surface electrode is increased and the frequency is reduced.

As an example of a method in which the frequency is raised and fine adjustments are carried out, a method as in JP 2002-359534A has been proposed. This is a method in which a portion of a surface electrode 207 is removed by etching as shown in FIG. 19, such that its resonance frequency is made higher than that of the resonator provided on a portion of a surface electrode 209. As another approach, a method as in JP 2002-335141A has been proposed. This is a method in which a surface loading layer 211 is arranged on a surface electrode 210 as shown in FIG. 20, and then the surface loading layer 211 is etched so that the resonance frequency of the resonator becomes a desired frequency.

However, with methods such as adjustment vapor deposition methods using mass loading or the method according to JP 2002-359539A, the frequency only can be adjusted in a downward direction. Furthermore, with the method according to JP 2002-359539A, the resistance of the surface electrode is increased by oxidization, and resonator characteristics deteriorate, such as the frequency acuteness Q value for example. A method is available in which the thickness of the oxidation layer is reduced as a method of reducing such deterioration in characteristics, but this involves narrowing the frequency adjustment width. Furthermore, there is also a method in which the thickness of the surface electrode 203 is increased so that the relative thickness of the oxidation layer 204 is reduced, but this reduces the degree of freedom in design since the surface electrode 203 is an important design parameter. Furthermore, this creates the problem of inviting fluctuation in parameters such as the electromechanical coupling coefficient.

With the method according to JP 2002-359534A in which frequencies are adjusted in an upward direction, the resistance of the surface electrode 207 is increased by reducing the thickness of the surface electrode 207, thus worsening the Q value. Furthermore, the problem also arises that a modified layer occurs in a portion of the surface electrode 207 due to etching and the resistance is similarly raised, thus worsening the Q value. Furthermore, empirically, the problem also arises that spurious signals, which are unwanted oscillations, tend to be produced when performing etching on portions of excitation portions of electrodes.

With the method according to JP 2002-335141A, a process by which a surface loading layer 211 is arranged becomes necessary, thus leading to increased costs. Since the surface loading layer 211 is arranged on a surface layer electrode 210, which is an excitation electrode, the problem arises in that it becomes easier for spurious signals to be produced.

SUMMARY OF THE INVENTION

An electronic component according to the present invention includes a substrate; a piezoelectric material layer supported directly or indirectly by the substrate; a first electrode arranged on a surface of the piezoelectric material layer on an opposite side of the substrate; and a second electrode arranged on a surface of the piezoelectric material layer on the substrate side. The piezoelectric material layer is sandwiched between the first electrode and the second electrode. The first electrode has a smaller surface area than the piezoelectric material layer. A portion where the piezoelectric material layer is exposed from the first electrode includes a portion that is thinner than a thickness of the piezoelectric material layer between the first electrode and the second electrode.

A method for manufacturing an electronic component according to the present invention includes:

a first step of directly or indirectly arranging a second electrode on a substrate;

a second step of arranging a piezoelectric material layer on the second electrode, or on the substrate, or extending over both the second electrode and the substrate;

a third step of arranging a first electrode on a predetermined area on the piezoelectric material layer, the first electrode having a smaller surface area than the piezoelectric material layer; and a fourth step of etching a thickness of a portion where the piezoelectric material layer is exposed from the first electrode to be thinner than a thickness of the piezoelectric material layer between the first electrode and the second electrode.

DETAILED DESCRIPTION OF THE INVENTION

Figure 1:
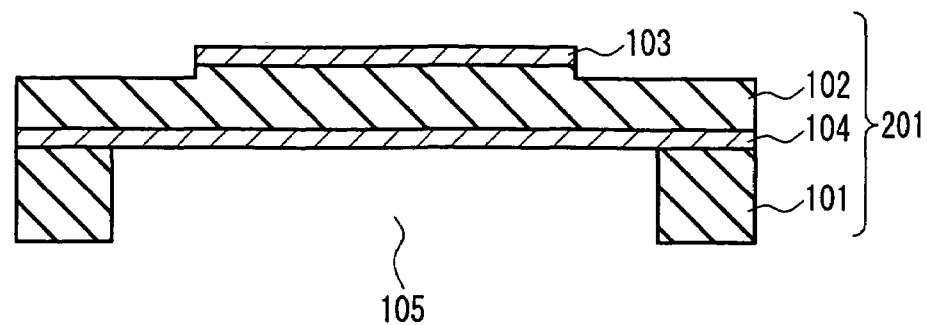
FIG. 1 is a cross section of a resonator in an electronic component according to Embodiment 1 of the present invention.

An electronic component according to the present invention has a piezoelectric material layer sandwiched between a first electrode on the surface side and a second electrode on the substrate side. The surface area of the first electrode is smaller than that of the piezoelectric material layer. Furthermore, in an area in which the piezoelectric material layer is exposed from the first electrode, there is an area that is thinner than the thickness of the piezoelectric material layer between the first electrode and the second electrode. Thus, for example, a resonator can be configured that has a frequency higher than ordinary resonance for example, and it is possible to configure an electronic component in which it is easy to adjust the resonance frequency of the resonator, improve the yield of the electronic component, and include a plurality of resonators of different frequencies.

Terms related to the present invention are defined below.

In the present invention, "electronic component" refers to a filter or a shared device or the like constituted by a plurality of resonators.

"Piezoelectric material" refers to a material performing a conversion between electrical energy and mechanical energy.

"Piezoelectric material area" refers to an area taking part in the oscillation of the piezoelectric material.

"Resonator" refers to an oscillating element or the like constituted by upper and lower electrodes and a piezoelectric material.

"Resonator not using an energy trapping effect" refers to a resonator or the like in which the displacement distribution is broadly distributed over the surface.

"Piezoelectric material thickness longitudinal oscillation" refers to oscillation in which displacement occurs in the thickness direction of the piezoelectric material.

It is preferable that the resonance frequency that can be used by the electronic component is in the range of several tens of MHz to several tens of GHz.

"Ladder-type filter" refers to a filter configured by connecting a plurality of resonators with serial branches and parallel branches.

"Q value" refers to a characteristic parameter of a resonator and is the value of an indicator that expresses the acuteness of the resonance.

An electronic component according to one example of the present invention includes at least a first piezoelectric material area at which the piezoelectric material layer is not supported by the substrate, and a second piezoelectric material area at which the piezoelectric material layer is not supported by the substrate but excluding the first piezoelectric material area, and includes at least one piezoelectric resonator wherein a portion or all of the second piezoelectric material area is thinner the first piezoelectric material area.

It is preferable that a portion of the second piezoelectric material area has the same thickness as the first piezoelectric material area. Thus, the surface area of the second piezoelectric material area that is thinner than the first piezoelectric material area can be made smaller, thus enabling the frequency adjustment amount to be smaller. Accordingly, fine adjustments of frequency become possible, and as a result of this, in addition to adjustments based on making the second piezoelectric material area thinner, adjustments based on making the surface area smaller are also possible, thus enabling frequency adjustments to be carried out with smaller widths. Furthermore, by setting the second piezoelectric material area having the same thickness as the first piezoelectric material area at the boundary of the substrate and the piezoelectric material layer, or on the outer side of the boundary of the substrate and the piezoelectric material layer, the fracture strength of the piezoelectric material layer at the boundary portion is increased, and component breakage in drop tests and the like is reduced.

It is preferable that the electronic component is constituted by at least two resonators of different resonance frequencies. This enables the configuration of an electronic component made of a plurality of resonators, for example, it becomes possible to configure a ladder-type filter.

It is preferable that a thickness of the second piezoelectric material area is the same for all resonators. This reduces elastic, non-continuous surfaces and increases the Q value of the electronic component.

It is preferable that the electronic component includes a plurality of resonators with different thicknesses of the second piezoelectric material area. This enables the configuration of an electronic component made of a plurality of resonators, for example, it becomes possible to configure a ladder-type filter.

It is preferable that the electronic component includes a plurality of resonators with different surface areas of the first piezoelectric material area. This enables the configuration of an electronic component made of a plurality of resonators, for example, it becomes possible to configure a ladder-type filter.

It is preferable that the piezoelectric material is aluminum nitride. This enables the configuration of an electronic component with favorable characteristics. Moreover, a better result of frequency adjustments can be achieved compared to other materials.

It is preferable that the substrate is made of silicon. This enables high-precision processing such as dry etching and wet etching to be achieved easily, and achieves a low-cost, high-performance component. When using silicon for the substrate, it is preferable that an insulating layer made of silicon oxide, silicon nitride, or AlN or the like is provided between the second electrode and the substrate.

It is preferable that the first electrode and the second electrode are made of at least one material selected from a group including gold, molybdenum, tantalum, palladium, platinum, titanium, and tungsten. When molybdenum is used as a base electrode, it is possible to achieve good film properties with a piezoelectric material such as aluminum nitride. Furthermore, by using any of gold, molybdenum, tantalum, palladium, platinum, titanium, or tungsten, there is chemical stability and superior environment-resistance (for example, at high temperatures and high humidity) when configuring a component.

It is preferable that the resonator does not use an energy trapping effect. Ideally, there is almost no effect of the present invention when an energy trapping effect is used. For example, when configuring an electronic component according to the present invention using oscillation involving crystal thickness shear confinement, the amount of the frequency adjustment is too small to be suitable in practice.

It is preferable that an oscillation mode of the resonator is thickness longitudinal oscillation. It is preferable that this oscillation mode is used when attempting to achieve the maximum effect of the present invention.

Furthermore, it is possible to apply an electronic component resonator in which the substrate does not include an oscillation space, and wherein a multilayer film of an inorganic substance constituting an acoustic mirror is present between the substrate and the second electrode.

It is preferable that a thickness of a portion where the piezoelectric material layer is exposed from the first electrode is at least 10 nm to at most 400 nm thinner than a thickness of the piezoelectric material layer between the first electrode and the second electrode.

Furthermore, a portion with a thin thickness of a portion where the piezoelectric material layer is exposed from the first electrode may have a stepped shape or may be tapered shape. A stepped shape can be formed by dry etching, and a tapered shape can be formed by wet etching.

In a manufacturing method of an electronic component according to the present invention, it is preferable that the fourth step includes a step of masking a portion that is not etched. This makes it possible to reduce the thickness of the second piezoelectric material area in desired portions.

In the fourth step, it is preferable that a portion of the second piezoelectric material area is etched. This makes it possible to reduce the thickness of the second piezoelectric material area in desired portions.

Furthermore, for an electronic component including at least two resonators, it is preferable that, after the third step, there is included a step of masking a portion of the piezoelectric material layer of a predetermined resonator. This makes it possible to reduce the thickness of a portion or all of the second piezoelectric material areas of a predetermined resonator.

It is preferable that the fourth step is dry etching. This enables high precision processing and makes it possible to achieve fine frequency adjustments.

It is preferable that in the third step and the fourth step etching is performed, and that the same etching mask is used. This makes it possible to omit a masking step, achieve process simplification, and reduce manufacturing costs.

The third step may involve forming a first electrode by transfer or etching.

It is preferable that a step of measuring a thickness of the piezoelectric material layer is included after the second step. Thus, the unadjusted properties of the resonator can be known in advance, thus providing a basis by which the amount of etching in the fourth step can be determined. Accordingly, in comparison to when this step is not included, it is easier to achieve component performance proximal to specifications, thus enabling improved yield in the manufacture of the component.

It is preferable that a step of testing, in which the resonance frequency of the resonator is measured, is included after the fourth step. This enables the frequency of a frequency-adjusted resonator to be known in advance, and components that do not meet specifications at this stage may be judged to be defective. It is also possible to perform further etching and frequency adjustments until the component meets specifications. It is further possible to perform additional readjustments by mass addition. Furthermore, when the component is judged to be defective, it is not necessary then to perform assembly processes such as packaging, thus enabling manufacturing costs to be reduced as compared to the case of determining component defects after the manufacture of the component is complete.

Furthermore, it is preferable that a step of frequency adjustments based on mass loading is included. This enables frequency adjustments based on frequency reductions, and, in combination with the present invention, enables frequency adjustments to be made in both upward and downward directions.

In the present invention, for example, AlN, ZnO, $KNbO_3$, $LiTaO_3$, $LiNbO_3$, PZT (lead zirconate titanate, Pb (Zr, Ti)$O_3$), and the like may be used as the piezoelectric material layer. The total thickness including the thicknesses of the upper and lower electrodes is set to ½ λ. The upper and lower electrodes use Mo, W Al, or Au or the like for example. The substrate, for example, uses Si, glass, or sapphire or the like, with a thickness set to 100 µm to 150 µm.

It should be noted that in the present invention, both the first and the second electrode may contact the piezoelectric material directly or via a dielectric material, such as $SiO_2$. If the first and the second electrode contact the piezoelectric material via a dielectric material, then spurious frequencies can be eliminated even better, and the adhesive strength can be improved. Furthermore, the electrodes may be made of a single layer or layered as multi-layer electrodes. The material for the electrodes may be a single metal or an alloy.

With the present invention, it is possible to configure a resonator with a higher frequency than its ordinary resonance. Furthermore, it is easy to achieve an adjustment of the resonance frequency of the resonator, thus enabling improved yields of the component. It is possible to configure an electronic component that includes a plurality of resonators of different frequencies, thus enabling simplification of a manufacturing method also, as well as reduced costs.

The following is a description of embodiments of the present invention with reference to the accompanying drawings.

Embodiment 1

Figure 2:
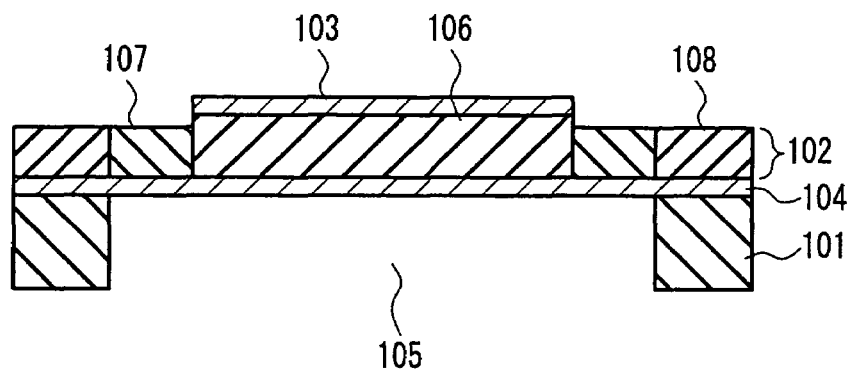
FIG. 2 is a cross section (for illustrating the various areas) of a resonator in the electronic component according to Embodiment 1.

A first embodiment of the present invention is described using FIGS. 1 and 2 and 3A to 3F. FIGS. 1 and 2 are cross sections of a resonator portion of an electronic component according to the present embodiment. The electronic component may be configured by a single resonator as shown in these drawings, or a collection of a plurality of resonators. FIGS. 3A to 3F show a method for manufacturing an electronic component.

First, the configuration of the present embodiment is described. Reference numeral 101 denotes a substrate, for example, a silicon substrate. Reference numeral 102 denotes a piezoelectric material layer, for example, a thin film of aluminum nitride. Reference numeral 103 denotes a first electrode for excitation, which applies an electrical field to the piezoelectric material layer 102 to achieve elastic oscillation. Reference numeral 104 denotes a second electrode that is arranged in a position opposite the first electrode 103. For example, in the present embodiment, molybdenum is used as an electrode material for both of these. A resonator 110 is configured by the above-described elements. It should be noted that an actual electronic component may be configured with a single resonator 110 or with a collection of a plurality of resonators 110.

Next, the resonator according to the present embodiment is a piezoelectric resonator whose oscillation mode is thickness longitudinal oscillation. Thickness longitudinal oscillation is an oscillation mode in which extending/contracting elastic oscillation is carried out in a direction parallel to the applied electrical field. In the present embodiment, the piezoelectric material layer 102 extends and contracts by an electrical field applied between the first electrode 103 and the second electrode 104. The frequency of oscillation is determined by the thickness of the piezoelectric material layer 102. It should be noted that, in the present embodiment, the first electrode 103 is made of molybdenum for example and has a thickness of 0.4 µm, and also the second electrode 104 is made of molybdenum and has a thickness of 0.4 µm. The piezoelectric material layer 102 is made of aluminum nitride and is sandwiched between the first electrode 103 and the second electrode 104 with a thickness of 1 µm. The piezoelectric material layer 102 has a reduced depth of 0.5 µm around the periphery of the first electrode 103 due to etching. Furthermore, the first electrode 103 has a size of 120 µm by 120 µm, and the size of the portion of the piezoelectric material layer 102 not supported by the substrate 101 is 160 µm by 160 µm.

Figure 11:
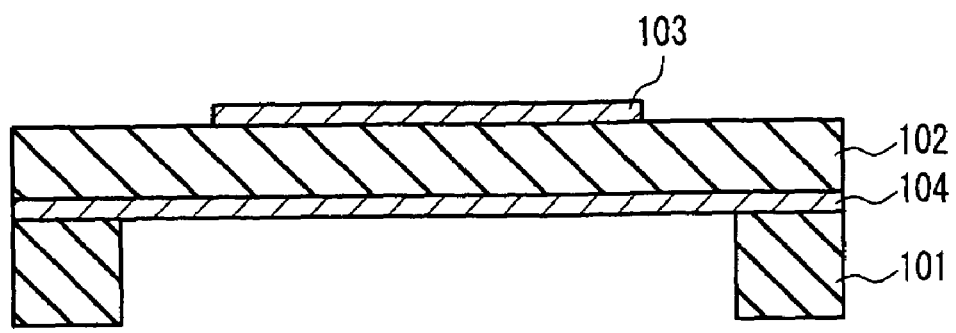
FIG. 11 is a drawing for describing a conventional comparative example.

Next, characteristics of the present embodiment are described using FIG. 2. In FIG. 2, reference numeral 105 denotes an oscillation space, which is a space arranged so that the elastic oscillation of the piezoelectric material layer 102 is not hindered. Reference numerals 106 to 108 indicate areas of the piezoelectric material layer 102. Reference numeral 106 denotes a first piezoelectric material layer area, which is an area of the piezoelectric material layer sandwiched between the first electrode 103 and the second electrode 104. Most of the electrical field applied to the first electrode 103 and the second electrode 104 is concentrated in the first piezoelectric material layer area 106. Reference numeral 108 denotes a supported piezoelectric material area, which is an area of the piezoelectric material layer 102 that is supported by the substrate 101. Reference numeral 107 denotes the remaining portions of the piezoelectric material layer 102. In the present embodiment, the second piezoelectric material area 107 is 0.1 µm thinner than the first piezoelectric material area 106. Thus, it is possible to increase the frequency in comparison to a conventional configuration such as that shown in FIG. 11. In particular, when aluminum nitride is used as the material for the piezoelectric material layer 102 and thickness longitudinal oscillation is used as the oscillation mode as in the present embodiment, there is no energy trapping in the first piezoelectric material area 106 and little decay of the elastic oscillation of the second piezoelectric material area 107. Accordingly, the coefficient of variation of the frequency with respect to the amount of etching of the second piezoelectric material area 107 can be made larger than in a configuration using energy trapping.

Conversely, with a device configuration using energy trapping, for example, using zinc oxide as a material for the piezoelectric material layer 102, there is greater decay of the elastic oscillation of the second piezoelectric material area 107 and the coefficient of variation of the frequency is small. To make the coefficient of variation larger, it is necessary to reduce the degree of confinement, that is, to reduce the mass of the first electrode 103.

Figure 3A:
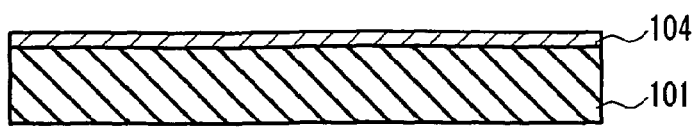
FIGS. 3A to 3F are process drawings of a method for manufacturing the electronic component according to Embodiment 1.

Next, a manufacturing method according to the present embodiment is described using FIGS. 3A to 3F. First, in a first step, the second electrode 104 is disposed on the silicon substrate 101 by sputtering (FIG. 3A). An insulating film is omitted here. It should be noted that other methods such as vacuum deposition and ion plating also may be used as the method for forming an electrode. Also note that, in the present embodiment, the second electrode is made of molybdenum and has a thickness of 0.4 μm.

Figure 3B:
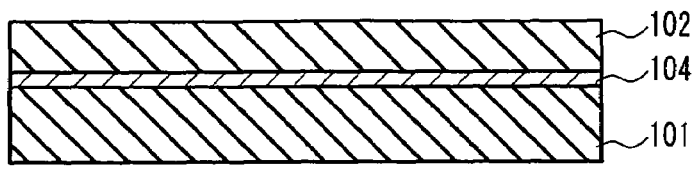

Next, in a second step, the piezoelectric material layer 102 is disposed on the second electrode 104 by sputtering (FIG. 3B). In the present embodiment, the piezoelectric material layer is made of aluminum nitride and has a thickness of 1 μm.

Figure 3C:
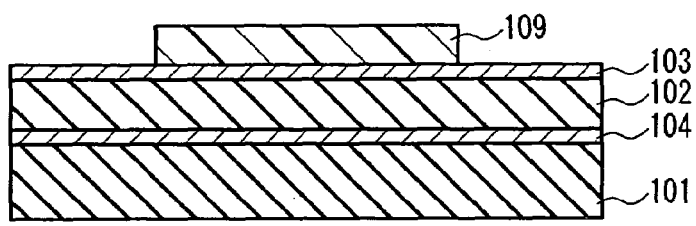
Figure 3D:
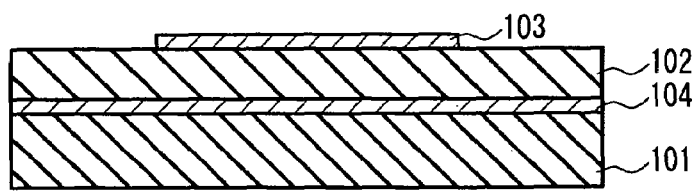
Figure 3E:
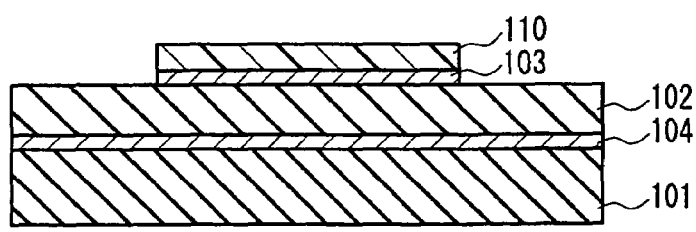
Figure 3F:
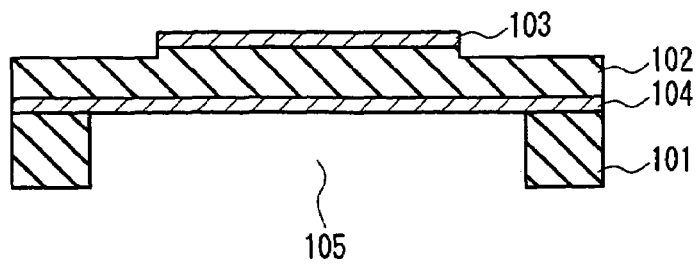
Figure 13:
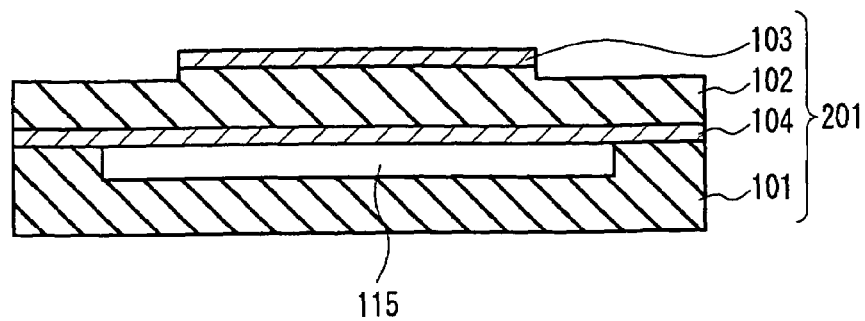
FIG. 13 is a cross section of a resonator in an electronic component according to Embodiment 1 of the present invention.

Methods such as chemical vapor deposition (CVD) also may be used as the method for forming the piezoelectric material layer 102. Next, a masking material 109 is applied. The masking material 109 is, for example, a photoresist, which is applied by spin coating, exposed, and developed, thus being patterned to a predetermined shape as shown in FIG. 3C. Next, in a third step, the first electrode 103 is etched to a predetermined shape. In the present embodiment, etching is performed using dry etching, but other methods such as wet etching may be used (FIG. 3D). At this stage, the resonance frequency of a dummy sample that has been introduced is measured, and the amount of etching of the piezoelectric material layer 102 in a following fourth step is determined. Next, as shown in FIG. 3E, patterning to a predetermined shape is carried out using a masking material 110. Next, in the fourth step, the piezoelectric material layer 102 is etched by a predetermined amount, and the resonance frequency is increased by a predetermined amount. It should be noted that, dry etching also is used here for etching, but other methods may be used. Finally, in a fifth step, the substrate 101 is etched and the oscillation space 105 is provided (FIG. 3F). In the present embodiment, dry etching is used as the etching method, but it is also possible to use other methods such as wet etching. Furthermore, the oscillation space 115 was formed such that the substrate 101 was completely hollowed out, but an oscillation space 115 of a closed gap type in which a portion of the substrate 101 is etched as shown in FIG. 13 is also possible. The oscillation space 115 has a thickness of approximately 2 μm. To form the oscillation space 115, a space may be formed by grinding the surface of a Si substrate in advance, and a readily soluble material such as PSG (phosphosilicate glass) may be embedded, and then this PSG can be removed by etching after the resonator is formed.

Figure 14:
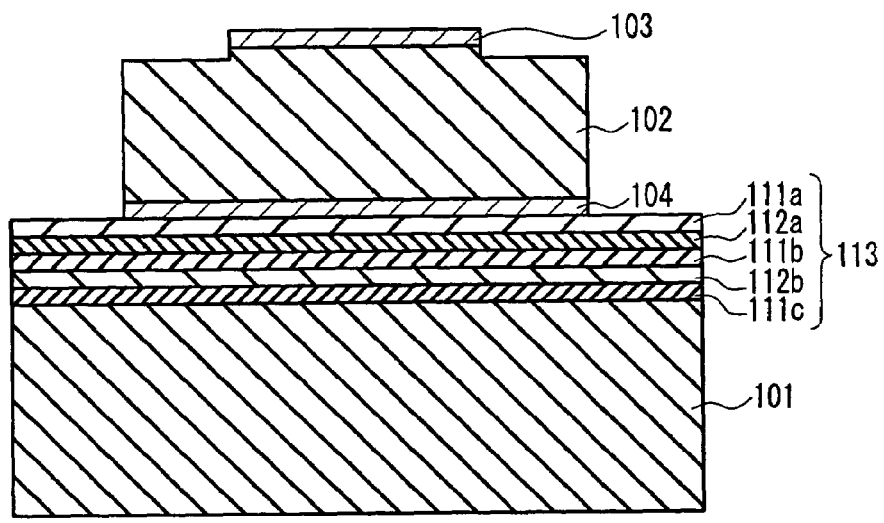
FIG. 14 is a cross section of another resonator in an electronic component according to Embodiment 1 of the present invention.

Furthermore, as shown in FIG. 14, an acoustic mirror 113 may be formed instead of the oscillation space. The acoustic mirror 113 is made by laminating low impedance layers 111a, 111b, and 111c and high impedance layers 112a and 112b on the surface of the Si substrate. Materials such as $SiO_2$, $Si_3N_4$, and AlN for example may be used for the low impedance layers. Materials such as W and Mo for example may be used for the high impedance layers. The respective thicknesses should be set to ¼ λ with respect to the acoustic velocity, which is determined by the material.

In FIG. 3F, the post-etching taper in the present embodiment is shown to be vertical (a direction parallel to the thickness direction), but this may be different depending on the etching method, the type of substrate used, and the orientation. For example, RIE (reactive ion etching), which is one type of a dry etching method, is an example of a method by which a vertical taper such as that of the present embodiment can be achieved. Furthermore, an example for wet etching is anisotropic etching in which the (110) face of silicon is taken as the etched surface (the surface normal to the thickness direction), and potassium hydroxide, or sodium hydroxide or the like is used as an etchant.

With an electronic component according to the present embodiment, it is possible to configure a resonator that has a higher frequency than its ordinary resonance frequency. Furthermore, the resonance frequency of the resonator can be adjusted easily. Furthermore, in combination with a frequency adjustment method based on mass loading, it is possible to raise or lower the resonance frequency of the resonator easily.

It should be noted that molybdenum was used in the present embodiment as the material for the first electrode 103 and the second electrode 104, but there is no limitation to this. However, when it is desired to increase the electromechanical coupling factor, it is necessary to increase the mass of the electrode. A method for doing this is to increase the thickness of the electrode, but if the thickness is increased excessively, there is the problem of residual stress remaining, or that temperature properties are affected adversely due to differences in the rate of thermal expansion, and therefore it is preferable to increase the density of the electrode. Furthermore, excessive increases in the electrode resistance are linked to deterioration of the resonator's Q value. Accordingly, it is preferable that a material selected from the group gold, silver, molybdenum, palladium, tantalum, and tungsten is used as the electrode material. It is also possible here that the electrode is a lamination of a plurality of materials, or it may be an alloy. Furthermore, when conversely it is desired or permissible to decrease the electromechanical coupling factor, it is preferable that Al is used as the electrode material.

It should be noted that, in the dummy sample resonance frequency measurement carried out prior to the fourth step of the method for manufacturing the present embodiment, the resonance frequency may be lowered using mass loading when the resonance frequency is greater than a predetermined amount. When it is not desired to carry out a frequency adjustment process using mass loading in order to ensure process simplification, the thickness can be set thicker in advance when forming the film of the piezoelectric material layer 102 of the second step.

Embodiment 2

Figure 4:
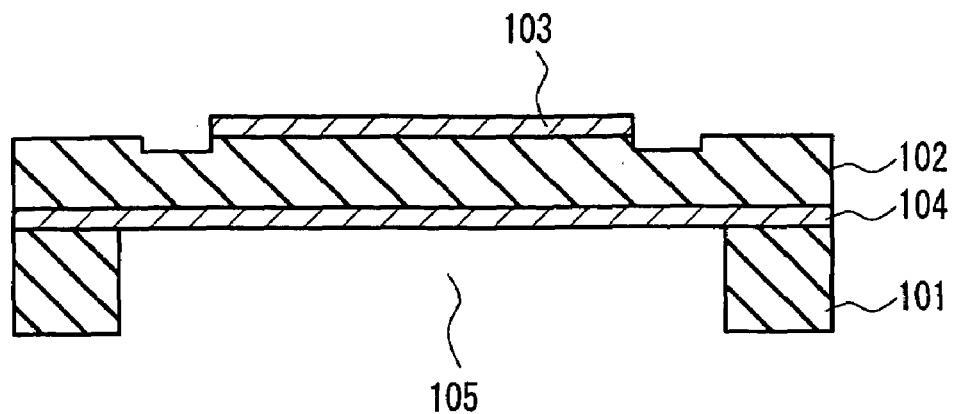
FIG. 4 is a cross section of a resonator in an electronic component according to Embodiment 2 of the present invention.
Figure 5:
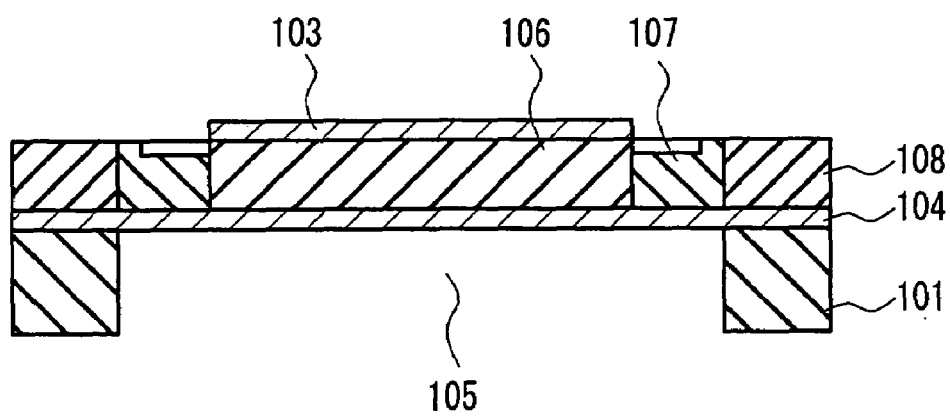
FIG. 5 is a cross section (for illustrating the various areas) of a resonator in an electronic component according to Embodiment 2.
Figure 6A:
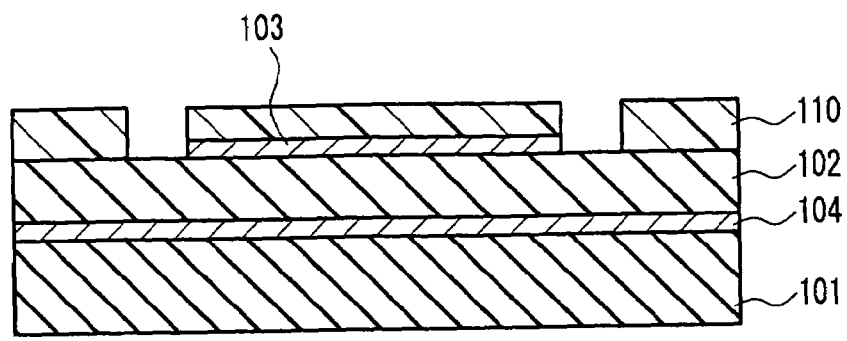
FIGS. 6A and 6B are drawings illustrating a manufacturing method of the electronic component according to Embodiment 1.
Figure 6B:
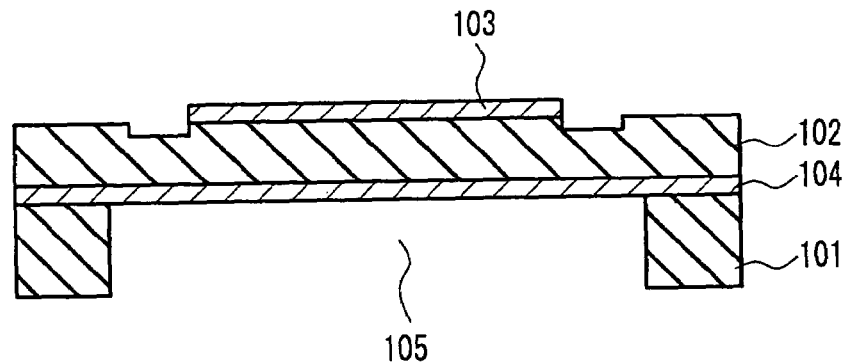

A second embodiment of the present invention is described using FIGS. 4 to 6A–6B. FIGS. 4 and 5 are cross sections of a resonator portion of an electronic component according to the present embodiment. The electronic component may be configured with a single resonator as shown in these drawings, or a collection of a plurality of resonators. FIGS. 6A and 6B show part of a method for manufacturing an electronic component. Common reference numerals are the same as in the first embodiment. The present embodiment is configured such that a thickness of only a portion of the second piezoelectric material area 107 is smaller than the thickness of the first piezoelectric material area 106. Furthermore, since except for the fourth step the manufacturing method here is overall the same as in the first embodiment, only the fourth step and the masking step prior to it will be described here. As shown in FIG. 6A, patterning is carried out such that the masking material 110 is provided with a predetermined shape. Next, in the fourth step, the piezoelectric material layer 102 is etched by a predetermined amount to raise the resonance frequency to a predetermined amount (FIG. 6B). The value of the increase of the resonance frequency of the resonator becomes larger for smaller masses of the second piezoelectric material area 107. Accordingly, it is also possible to change the variable width of frequency by adjusting the surface area of the thin portion of the second piezoelectric material area 107. For example, when frequency adjustments that require extra-ordinary precision are required, the value of the increase (coefficient of variation of the frequency) becomes smaller with respect to the amount of etching in the thickness direction by making the surface area of the thin portion smaller. Conversely, when it is desired to have large unevenness in frequencies and for a large adjustment width, the surface area of the thin portion may be made larger. Compared to the first embodiment, the coefficient of variation of the frequency becomes smaller in the present embodiment, thus enabling highly precise adjustments.

Embodiment 3

Figure 12:
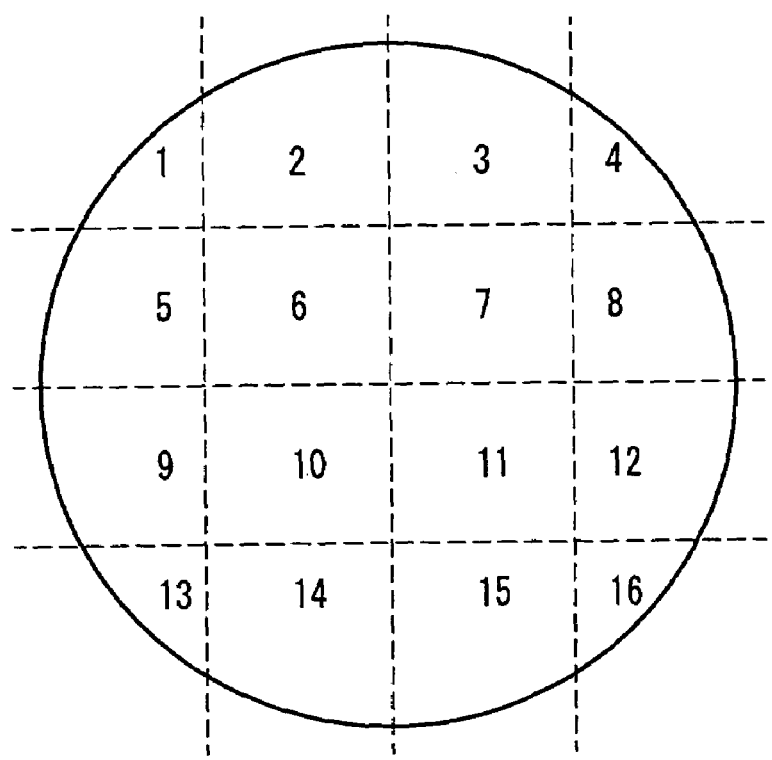
FIG. 12 is a drawing illustrating a method for manufacturing an electronic component according to Embodiment 3 of the present invention.

A manufacturing method of a third embodiment of the present invention is described using FIGS. 3 and 12. At the stage of the first step in the present embodiment, the substrate 101 is a 4-inch wafer silicon substrate. The first and second steps described in the first embodiment (FIGS. 3A and 3B) are carried out. After this, film thickness measurements are performed using an ellipsometer on 16 locations on the wafer as shown in FIG. 12. The results are shown in Table 1.

TABLE 1

| Position in wafer | 1 | 2 | 3 | 4 | 5 | 6 | 7 | 8 |
|---|---|---|---|---|---|---|---|---|
| Difference from predetermined value (%) | −0.962 | −1.442 | −1.442 | −1.442 | −0.481 | −0.962 | −1.442 | −1.923 |
| Category | C | D | D | D | B | C | D | E |
| Position in wafter | 9 | 10 | 11 | 12 | 13 | 14 | 15 | 16 |
| Difference from predetermined value (%) | 0 | −0.962 | −1.442 | −1.923 | 0 | −0.481 | −1.442 | −1.923 |
| Category | A | C | D | E | A | B | D | E |

The numbers for positions in the wafer correspond to the positions shown in FIG. 12. The difference from the predetermined value refers to the discrepancy rate (%) of the measured thickness from the predetermined thickness. Furthermore, category refers to categories based on the difference from the predetermined value for carrying out post-process frequency adjustments, which are as follows when the difference from the predetermined value is given as $\Delta t$ (expressed as %):

Category A: when $0 \geq \Delta t > -0.25$
Category B: when $-0.25 \geq \Delta t > -0.75$
Category C: when $-0.75 \geq \Delta t > -1.25$
Category D: when $-1.25 \geq \Delta t > -1.75$
Category E: when $-1.75 \geq \Delta t > -2.25$ Next, masking is first carried out for the areas of categories A to D, and etching of the piezoelectric material layer 102 is performed in the fourth step such that the difference from the predetermined value becomes 0.5% smaller. The result of this is that the $\Delta t$ in areas that were category E in the initial measurement now become category D areas in which $-1.25 \geq \Delta t > -1.75$. Next, masking is carried out for the areas of categories A to C and the same step is performed. The result of this is that the $\Delta t$ in areas which were categories D or E in initial measurements now become category C areas in which $-0.75 \geq \Delta t > -1.25$. By similarly repeating the fourth step, the $\Delta t$ of all the wafer areas can be brought into a range of $0.25 \geq \Delta t > -0.25$. Next, the fifth step is carried out. It should be noted that, after this, chip cutting such as dicing is performed and the cut chips are packaged such that they become electronic components that can be mounted in devices.

With the manufacturing method of the present embodiment, it is possible to bring the resonance frequencies of resonators close to a predetermined value and to increase the yield of elements.

It should be noted that, in the present embodiment, resonance frequency adjustments were carried out after the second step by measuring the thickness of the piezoelectric material layer 102, but it is also possible to carry out adjustments by measuring the resonance frequency of the resonators after the fourth step. In this case, the measurements are performed by wafer probes.

Embodiment 4

Figure 7:
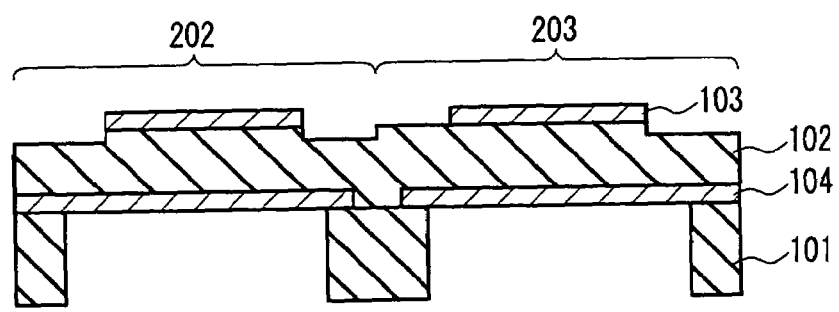
FIG. 7 is a cross section of an electronic component according to Embodiment 4 of the present invention.
Figure 15:
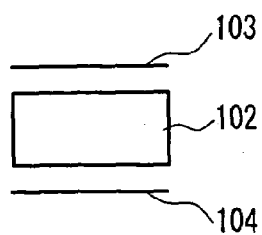
FIG. 15 is a drawing for describing an electronic component according to Embodiment 4 of the present invention.
Figure 16:
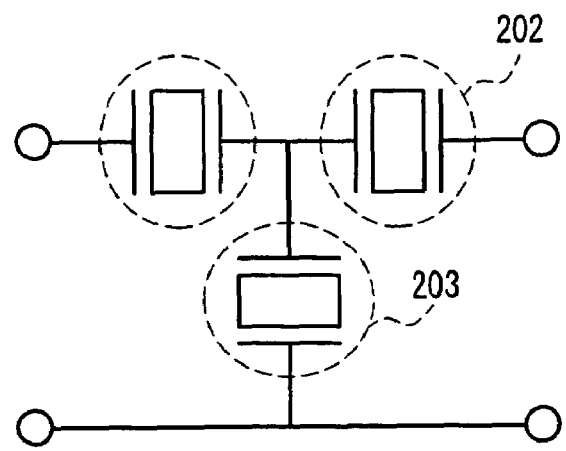
FIG. 16 is a drawing for describing the electronic component according to Embodiment 4.

A fourth embodiment of the present invention is described using FIGS. 7 and 8. In this embodiment, resonators of different resonance frequencies, for example a resonator 202 and a resonator 203, are formed together on the same substrate. The thicknesses of the first piezoelectric material area of both resonators are the same, but the thicknesses of the second piezoelectric material area are different, such that the resonance frequency f1 of the resonator 202 and the resonance frequency f2 of the resonator 203 have the relationship f1>f2. With such a configuration, it is possible to achieve a configuration of an electronic component in which resonators having multiple resonance frequencies are arranged in multiple locations on a single chip. For example, a filter can be configured by arranging the resonator 202 and the resonator 203 in a T-shape as shown in FIG. 16. First, using FIG. 15, the symbols used in FIG. 16 correspond to the piezoelectric material layer 102, the first electrode 103, and the second electrode 104 shown in FIG. 15.

Figure 8A:
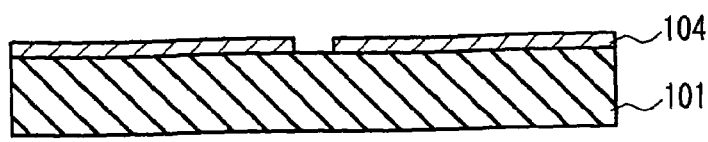
FIGS. 8A to 8F are process drawings of a method for manufacturing the electronic component according to Embodiment 4.
Figure 8B:
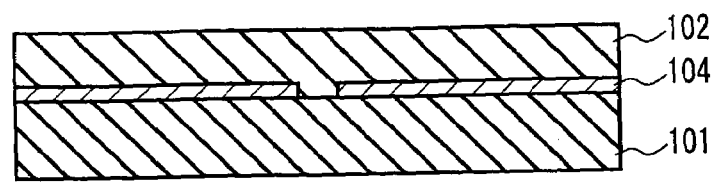
Figure 8C:
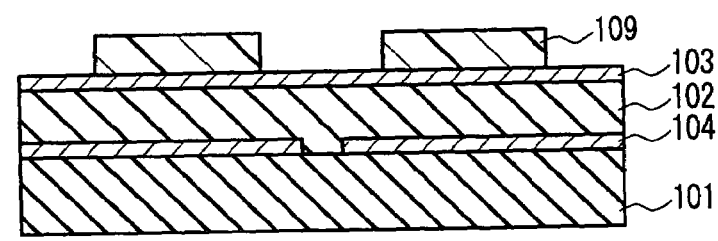
Figure 8D:
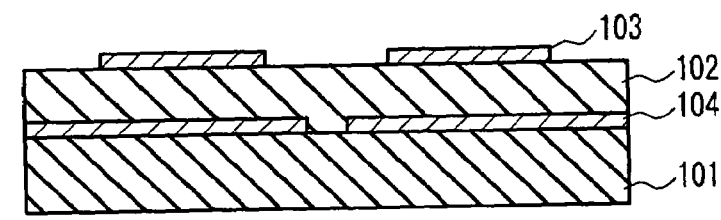
Figure 8E:
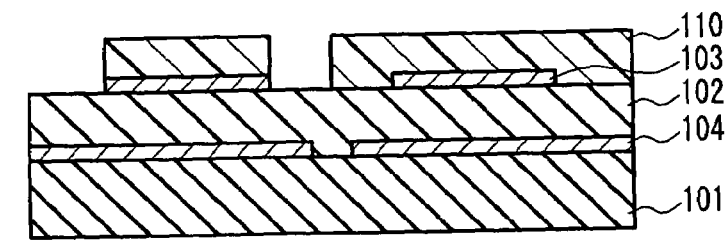
Figure 8F:
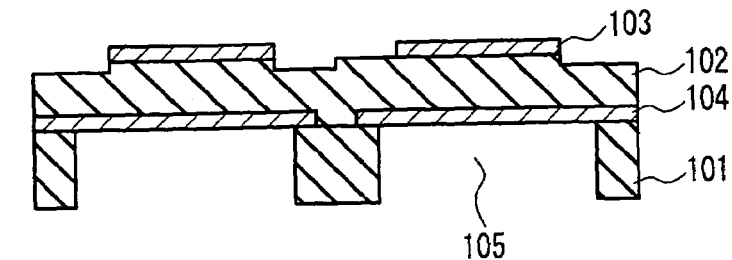

Next, a manufacturing method of the present embodiment is described using FIGS. 8A to 8F. In a first step, the second electrode 104 is disposed on the substrate 101 (FIG. 8A), and in a second step the piezoelectric material layer 102 is disposed on the second electrode 104 (FIG. 8B). A masking material is arranged (FIG. 8C) and the first electrode 103 is etched in a predetermined pattern (FIG. 8D). Next, as shown in FIG. 8E, a second piezoelectric material area that will become the resonator 202 is etched by a predetermined amount to raise the resonance frequency to the predetermined amount f1. Next, patterning is performed in a predetermined shape, and the piezoelectric material layer is etched in a fourth step, and the substrate 101 is etched in a fifth step, thus providing an oscillation space 105 (FIG. 8F).

With the above manufacturing method, resonators of different frequencies can be configured on the same substrate by a simple method.

Embodiment 5

Figure 9:
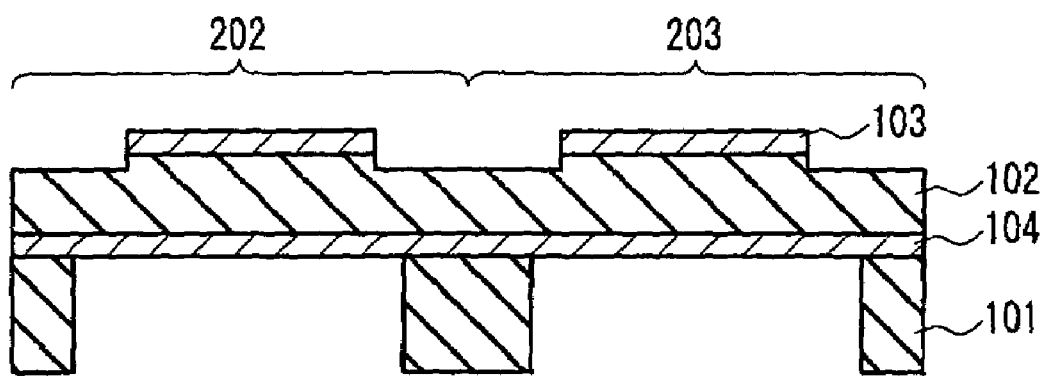
FIG. 9 is a cross section of an electronic component according to Embodiment 5 of the present invention.

A fifth embodiment of the present invention is described using FIGS. 9 and 10A to 10F. As in the fourth embodiment, the present embodiment also uses a configuration in which resonators of different resonance frequencies are formed together on the same substrate. In FIG. 9, the thicknesses of respective first electrode areas and second electrode areas of the resonators 202 and 203 are the same, but the surface areas of the first electrode areas are different, with the resonator 202 having a surface area S11 and the resonator 203 having a surface area S12, with the relationship of S11<S12. The resonator 202 has a resonance frequency f1 and the resonator 203 has a resonance frequency f2, with the relationship of f1>f2. With this structure, it is possible to configure an electronic component in which resonators are positioned in multiple locations with multiple resonance frequencies on a single chip. For example, a filter can be configured as in the fourth embodiment.

Figure 10A:
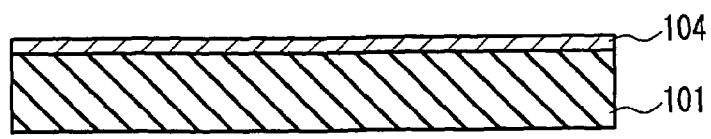
FIGS. 10A to 10F are drawings for describing a manufacturing method of the same electronic component.
Figure 10B:
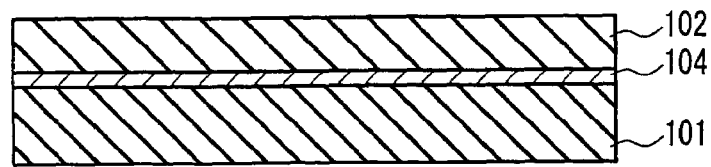
Figure 10C:
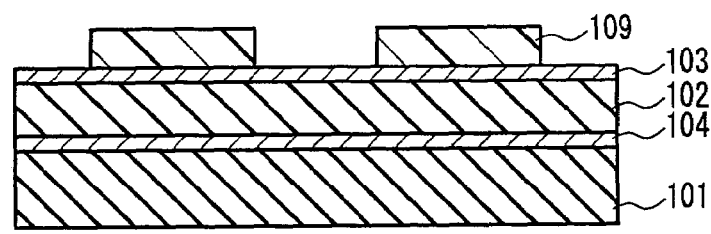
Figure 10D:
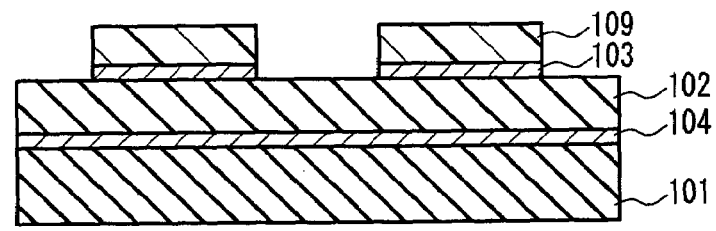
Figure 10E:
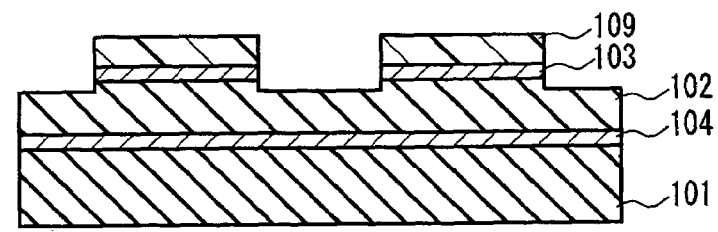
Figure 10F:
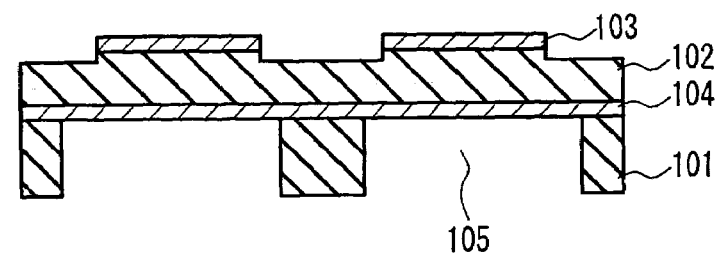

Next, a manufacturing method according to the present embodiment is described using FIGS. 10A to 10F. First, in a first step, the second electrode 104 is disposed on the silicon substrate 101 (FIG. 10A), and the piezoelectric material layer 102 is disposed on the second electrode 104 in a second step (FIG. 10B), then the masking material 109 is disposed (FIG. 10C). Here the masking material 109 is also used for the etching of the piezoelectric material layer 102 in the fourth step. The first electrode 103 is etched to a predetermined shape (FIG. 10D). Next, in a fourth step, the piezoelectric material layer 102 is etched by a predetermined amount to raise the resonance frequency to the predetermined amount f1 (FIG. 10E). Finally, in a fifth step, the substrate 101 is etched to provide an oscillation space 105 (FIG. 10F).

With the above manufacturing method, resonators of different frequencies can be configured on the same substrate by a simple method. Unlike the fourth embodiment, the same mask is used in the present embodiment for the etching of the first electrode 103 and the piezoelectric material layer 102, thus enabling process simplification, and making it possible to reduce costs. It should be noted that it is of course possible to change the masking material without problem for etching the piezoelectric material layer 102 to achieve the configuration of the present embodiment.

It also should be noted that in the fourth embodiment and the fifth embodiment, thicknesses or surface areas were changed to ensure the relationship f1>f2, but it is also possible to ensure this relationship by forming elements under the conditions of the following Expression 1.

$$[(tm11+tm12)\times S11 \times pm]/[(t11 \times S11+t12 \times S12)\times pp] < [(tm21+tm22)\times S21 \times pm]/[(t21 \times S21+t22 \times S22)\times pp]$$ Expression 1

In this expression, for the resonator 202, the thickness of the first piezoelectric material area 106 of the piezoelectric material layer 102 is t1 and its surface area is S11. The thickness of the second piezoelectric material area 107 is t12 and its surface area is S12. The thickness of the first electrode 103 is tm11 and the thickness of the second electrode 104 is tm12. For the resonator 203, the thickness of the first piezoelectric material area 106 of the piezoelectric material layer 102 is t21 and its surface area is S21. The thickness of the second piezoelectric material area 107 is t22 and its surface area is S22. The thickness of the first electrode 103 is tm21 and the thickness of the second electrode 104 is tm22. Furthermore, the density of the piezoelectric material layer 102 is pp and the density of the first electrode 103 and the second electrode 104 is pm.

Embodiment 6

Figure 17:
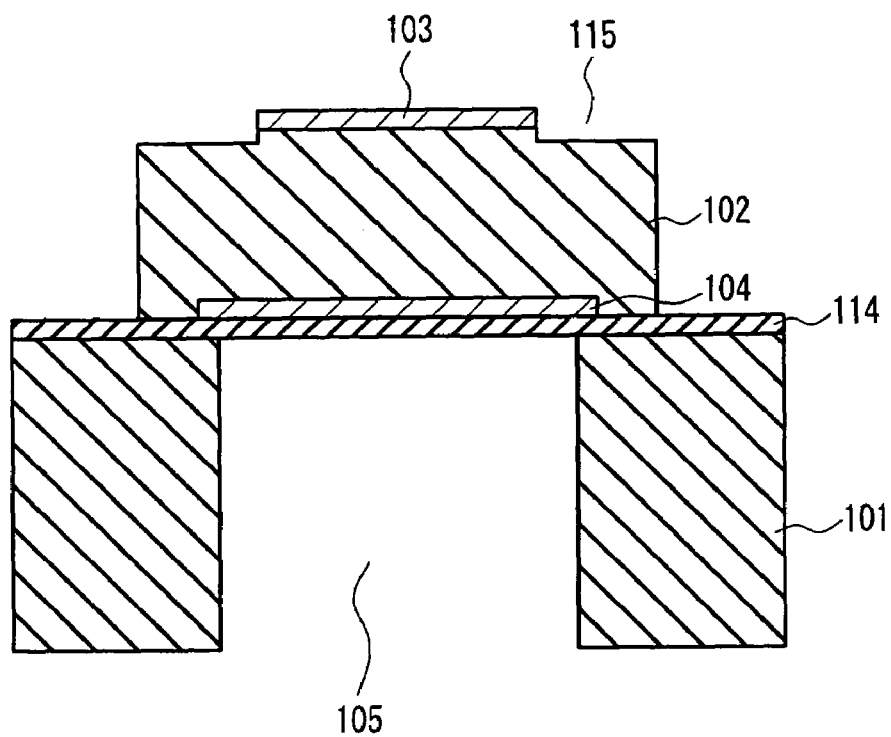
FIG. 17 is a drawing for describing an electronic component according to Embodiment 6 of the present invention.
Figure 18:
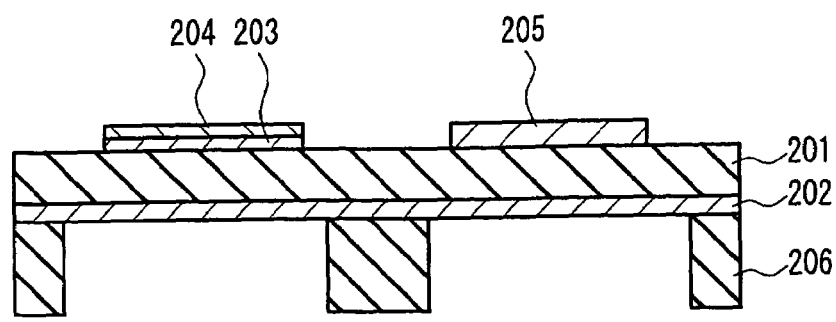
FIG. 18 is a drawing for describing resonators in a conventional example of an electronic component.
Figure 19:
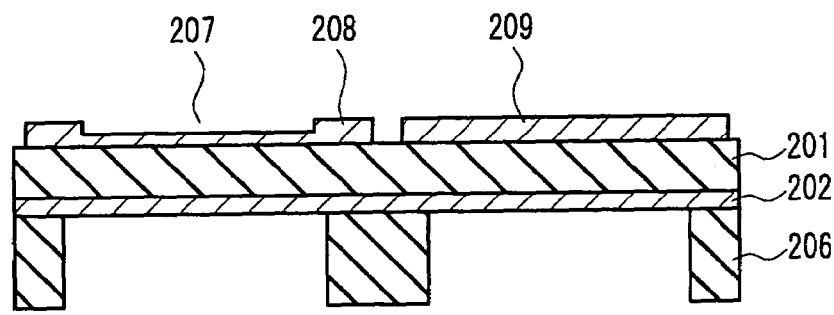
FIG. 19 is a drawing for describing resonators in a conventional example of an electronic component.
Figure 20:
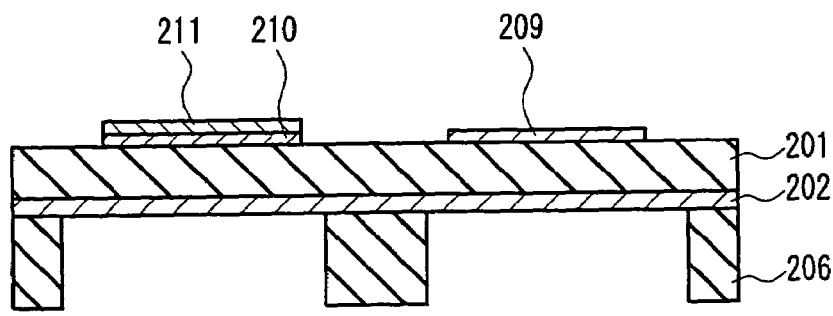
FIG. 20 is a drawing for describing resonators in a conventional example of an electronic component.

A sixth embodiment of the present invention is described using FIG. 17. In this embodiment, the effect of frequency adjustment was verified. In a center portion of a Si substrate 101 with a diameter of 0.6 to 1.0 mm and a thickness of 100 to 150 μm, an oscillation space 105 of 60 to 100 μm was provided. On top of this, thermally oxidized SiO₂ was formed as an insulating layer 114 with a thickness of 0.1 to 0.3 μm, and Mo was formed on this as a lower portion electrode 104, and AlN was formed on this as piezoelectric material layer 102, and Mo was formed on this as an upper portion electrode 103. When using a resonance frequency of 1.9 GHz, the thicknesses of the upper portion electrode 103, the piezoelectric material layer 102, and the lower portion electrode 104 were, for example, 0.5 μm (upper portion electrode 103)/0.8 μm (piezoelectric material layer 102)/0.2 μm (lower portion electrode 104). Furthermore, the diameter of the piezoelectric material layer 102 and the lower portion electrode 104 were set to 100 μm, and the diameter of the upper portion electrode 103 was set to 50 μm. The upper portion electrode 103 was used as a mask and the piezoelectric material layer 102 was etched to remove a depth of 0.1 μm, thus enabling an adjustment of approximately 100 kHz. This does not work in a linear manner, rather the amount of frequency change varies greatly depending on the planar shape, the electrode material, and the ratio of thicknesses between the electrodes and the piezoelectric material. In the present embodiment, a removed portion 115 was set to a depth of 0.3 μm.

It also occurs with conventional technologies when forming patterned electrodes by etching that a piezoelectric material layer 102 (AlN) of approximately several tens of nm is removed, but the change in the resonance frequency is of the order of several kHz. Accordingly, this is very different from the range of the present embodiment, which is capable of adjustments from several hundred kHz to several MHz.

As described above, an object of the present embodiment is to adjust the frequency by thoroughly etching the AlN, then thoroughly etching a portion of the resonator after the electrode is formed. Accordingly, it is preferable that the etching depth is at least 10 nm. Conversely, if excessive etching is performed, adverse effects can occur, such as the occurrence of spurious signals caused by etched edge surfaces, or significant deterioration of the crystalline properties of the piezoelectric thin film surface, and therefore it is preferable that etching is kept within, for example, approximately half the depth of the center portion of the piezoelectric material thin film.

In order to verify this, the etching depth of the piezoelectric material and the frequency adjustment result, as well as the occurrence of spurious signals were tested. The results of this are shown in Table 2 below. In Table 2, the etching amount is expressed in % taking the initial depth (800 nm) of the piezoelectric thin film as 1.

TABLE 2

| Etching depth (nm) | Etching amount (%) | Frequency adjustment effect | Occurrence of spurious signals |
|---|---|---|---|
| 0 | 0.00 | C | A (None) |
| 0.5 | 0.06 | C | A |
| 1 | 0.13 | B | A |
| 10 | 1.25 | A | A |
| 100 | 12.5 | A | A |
| 200 | 24.5 | A | A |
| 300 | 37.5 | A | B (Slight) |

TABLE 2-continued

| Etching depth (nm) | Etching amount (%) | Frequency adjustment effect | Occurrence of spurious signals |
|---|---|---|---|
| 400 | 50.0 | A | B |
| 500 | 62.5 | A | C |

(Notes) Frequency adjustment result: A = large change, B = slight change, C = no change in frequency.
Spurious frequency occurrence result: A = no effect, B = not problematic for practical application, C = effect evident.
Spurious signals are unwanted signals in the desired signals caused by unwanted oscillation modes.

As is evident from Table 2, it could be confirmed that an etching depth of the piezoelectric material in the range from at least 10 nm to at most 400 nm is preferable.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic component comprising at least one piezoelectric element including:
   a substrate;
   a piezoelectiic material layer supported directly or indirectly by the substrate;
   a first electrode arranged on a principal surface of the piezoelectric material layer;
   a second electrode arranged or the other surface of the piezoelectric material layer;
   wherein the piezoelectric material layer is sandwiched between the first electrode and the second electrode;
   wherein the plezocleotric material layer includes at least a first piezoelectric material area not supported by the substrate and a second piezoelectric material area, other than the first piezoelectric material area, in which the piezoelectric material layer is not supported by the substrate.
   wherein, in the piezoelectric material layer, the second electrode is formed at least on the other surface of the first piezoelectric material area and the second piezoelectric material area;
   wherein, in the piezoelectric material layer, the first electrode Is formed at least on the principal surface of the first piezoelectric material area; and
   wherein a part or an entirety of the second plezocleotric material area has a thickness smaller than that of the first plezocleotric material area;
   wherein the substrate does not include an oscillation space, and wherein a multilayer film of an inorganic substance constituting an acoustic mirror is present between the substrate and the second electrode.

2. The electronic component according to claim 1 forming a resonator, wherein the substrate includes an oscillation space, and wherein the piezoelectric material layer includes at least a first piezoelectric material area not supported by the substrate and a second piezoelectric material area, other the first piezoelectric material area, in which the piezoelectric material layer Is not supported by the substrate.

3. The electronic component according to claim 2, wherein a portion of the second piezoelectric material area has a same thickness as the first piezoelectric material area.

4. The electronic component according to claim 2, wherein the electronic component comprises at least two resonators with different resonance frequencies.

5. The electronic component according to claim 4, wherein a thickness of the second piezoelectric material area is the same in an entirety of resonators.

6. The electronic component according to claim 2, comprising a plurality of resonators with different thicknesses of the second piezoelectric material area.

7. The electronic component according to claim 2, comprising a plurality of resonators with different surface areas of the first piezoelectric material area.

8. The electronic component according to claim 1, wherein a thickness of a portion where the piezoelectric material layer is exposed from the first electrode is at least 10 nm and at most 400 nm thinner than a thickness of the piezoelectric material layer between the first electrode and the second electrode.

9. The electronic component according to claim 1, wherein a portion with a thin thickness of a portion where the piezoelectric material layer is exposed horn the first electrode has a stepped shape or a tapered shape.

10. The electronic component according to claim 1, wherein the piezoelectric material is aluminum nitride.

11. The electronic component according to claim 1, wherein the substrate is made of silicon.

12. The electronic component according to claim 1, wherein the first electrode arid the second electrode are made of at least one material selected from a group consisting of gold, molybdenum, tantalum, palladium, platinum, titanium, and tungsten.

13. The electronic component according to claim 1, wherein a resonator of the electronic component does not use an oscillation energy trapping effect.

14. The electronic component according to claim 1, wherein an oscillation mode of the piezoelectric material is thickness longitudinal oscillation.

15. The electronic component according to claim 1, wherein the second piezoelectric material area is formed so as to have a flat surface in a stepped shape with respect to the first piezoelectric material area.

* * * * *

UNITED STATES PATENT AND TRADEMARK OFFICE
CERTIFICATE OF CORRECTION

PATENT NO. : 7,170,215 B2  Page 1 of 1
APPLICATION NO. : 10/865125
DATED : January 30, 2007
INVENTOR(S) : Namba et al.

It is certified that error appears in the above-identified patent and that said Letters Patent is hereby corrected as shown below:

Column 15, line 34(claim 1): "arranged or the" should read --arranged on the--.
Column 15, line 38(claim 1): "plezocleotric" should read --piezoelectric--.
Column 15, line 43(claim 1): "substrate." should read --substrate;--.
Column 15, line 49(claim 1): "electrode Is formed" should read --electrode is formed--.
Column 15, line 51(claim 1): "plezocleotric" should read --piezoelectric--.
Column 15, line 53(claim 1): "plezocleotric" should read --piezoelectric--.
Column 16, line 7(claim 2): "other" should read --other than--.
Column 16, line 9(claim 2): "layer Is not" should read --layer is not--.
Column 16, line 33(claim 9): "exposed horn the" should read --exposed from the--.
Column 16, line 40(claim 12): "electrode arid the" should read --electrode and the--.

Signed and Sealed this

Eighteenth Day of September, 2007

JON W. DUDAS
*Director of the United States Patent and Trademark Office*